US009881847B2

(12) United States Patent
Perkins

(10) Patent No.: US 9,881,847 B2
(45) Date of Patent: Jan. 30, 2018

(54) SEMICONDUCTOR STRUCTURE HAVING THERMAL BACKSIDE CORE

(71) Applicant: Avago Technologies General IP (Singapore) Pte. Ltd., Singapore (SG)

(72) Inventor: Nathan Perkins, Windsor, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/221,543

(22) Filed: Jul. 27, 2016

(65) Prior Publication Data

US 2016/0351466 A1    Dec. 1, 2016

Related U.S. Application Data

(62) Division of application No. 14/624,526, filed on Feb. 17, 2015, now Pat. No. 9,472,484.

(51) Int. Cl.

| | |
|---|---|
| H01L 23/367 | (2006.01) |
| H01L 29/06 | (2006.01) |
| H01L 23/498 | (2006.01) |
| H01L 23/482 | (2006.01) |
| H01L 23/66 | (2006.01) |
| H01L 23/48 | (2006.01) |
| H01L 23/00 | (2006.01) |

(52) U.S. Cl.
CPC ........ *H01L 23/367* (2013.01); *H01L 23/3675* (2013.01); *H01L 23/3677* (2013.01); *H01L 23/4821* (2013.01); *H01L 23/49844* (2013.01); *H01L 23/66* (2013.01); *H01L 24/32* (2013.01); *H01L 29/0657* (2013.01); *H01L 23/481* (2013.01); *H01L 24/03* (2013.01); *H01L 24/05* (2013.01); *H01L 24/48* (2013.01); *H01L 2224/0345* (2013.01); *H01L 2224/0346* (2013.01); *H01L 2224/04026* (2013.01); *H01L 2224/05624* (2013.01); *H01L 2224/05639* (2013.01); *H01L 2224/05644* (2013.01); *H01L 2224/05647* (2013.01); *H01L 2224/05684* (2013.01); *H01L 2224/32058* (2013.01); *H01L 2224/32105* (2013.01); *H01L 2224/32225* (2013.01); *H01L 2224/73265* (2013.01); *H01L 2924/00014* (2013.01); *H01L 2924/10158* (2013.01); *H01L 2924/142* (2013.01); *H01L 2924/1421* (2013.01)

(58) Field of Classification Search
CPC ................... H01L 2924/1033; H01L 29/2003
See application file for complete search history.

(56) References Cited

U.S. PATENT DOCUMENTS

| | | | | |
|---|---|---|---|---|
| 5,856,911 A * | 1/1999 | Riley | ...................... | G06F 1/203 174/16.3 |
| 5,946,544 A * | 8/1999 | Estes | ................... | H01L 23/3675 257/E23.087 |
| 6,011,692 A * | 1/2000 | Bergstedt | ................ | H01L 23/13 174/260 |
| 9,472,484 B2 * | 10/2016 | Perkins | ............... | H01L 23/3677 |

(Continued)

*Primary Examiner* — Thao P Le

(57) ABSTRACT

A semiconductor structure includes a semiconductor substrate having a recess disposed beneath a semiconductor device. The semiconductor structure also includes a thermally conductive core disposed in the recess, and a package substrate including a heat sink. The heat sink is in thermal contact with the thermally conductive core.

45 Claims, 4 Drawing Sheets

(56) References Cited

U.S. PATENT DOCUMENTS

| | | | |
|---|---|---|---|
| 2003/0230799 A1* | 12/2003 | Yee | H01L 23/3128 257/706 |
| 2006/0125088 A1* | 6/2006 | Huang | H01L 21/4871 257/707 |
| 2008/0157341 A1* | 7/2008 | Yang | H01L 23/467 257/700 |
| 2011/0140260 A1* | 6/2011 | Bonthron | H01L 23/04 257/690 |
| 2011/0174526 A1* | 7/2011 | Takematsu | H01L 23/13 174/258 |
| 2012/0037935 A1* | 2/2012 | Yang | H01L 31/0203 257/98 |
| 2012/0138977 A1* | 6/2012 | Li | H01L 25/0753 257/89 |
| 2014/0183699 A1* | 7/2014 | Dahlstrom | H01L 23/3735 257/537 |
| 2015/0048484 A1 | 2/2015 | Perkins et al. | |
| 2015/0061096 A1* | 3/2015 | Goh | H01L 23/13 257/676 |

* cited by examiner

SEMICONDUCTOR STRUCTURE HAVING THERMAL BACKSIDE CORE

CROSS-REFERENCE TO RELATED APPLICATIONS

The present application is a divisional application under 37 C.F.R. §1.53(b) of U.S. patent application Ser. No. 14/624,526 naming Nathan Perkins as inventor. Priority is claimed under 35 U.S.C. §120 to U.S. patent application Ser. No. 14/624,526, and the entire disclosure of U.S. patent application Ser. No. 14/624,526 is specifically incorporated herein by reference.

BACKGROUND

Heat dissipation is becoming an increasingly important issue for mobile power amplifiers, such as those comprising Group III-V semiconductor devices. The requirement for better thermal conduction is partly due to shrinking power amplifier die and package sizes, which increases the demands simply by increasing the thermal densities. In addition, modern mobile amplifiers typically operate at higher data rates, and closer to peak output powers on average. Moreover, the increased multi-band capabilities of modern mobile amplifier modules generally means that the amplifier must overcome greater series insertion loss to the antenna (in the form of increased switch and filter content), which also increases the power demand on the amplifier.

The thermal resistances of materials in a structure impact the ability to dissipate heat. According to a known amplifier structure, minimum values for thermal resistance are obtained when the power amplifier die thickness is minimized, or when the output area occupied by the power transistor is increased. Both of these factors are undesirable from a practical point of view. For example, minimizing the power amplifier die thickness increases yield loss problems associated with thin wafer handling and breakage, and also increases yield loss problems associated with thin die pick and place in packaging. Also, increasing the output area occupied by the power transistor increases the overall power amplifier die area, which consequently increases the cost of the power amplifier die and the overall package size. In practice, lower cost power amplifier die and smaller overall package sizes are highly desirable.

What is needed, therefore, is a semiconductor structure that overcomes at least the shortcomings described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
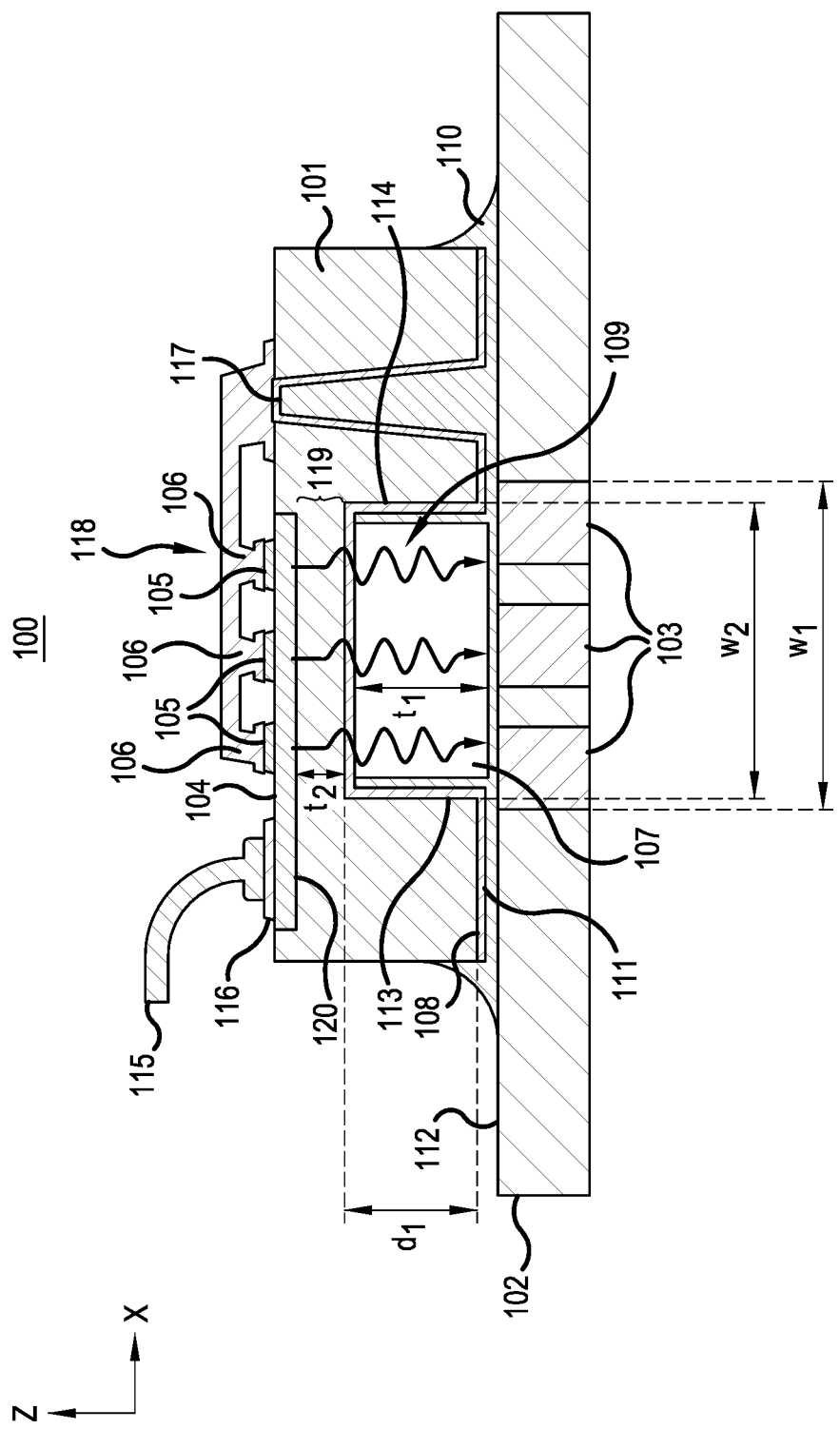
FIG. 1 shows a cross-sectional view of a portion of a semiconductor structure in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

Unless otherwise noted to the contrary below, when a first element (e.g., electrical component or circuit) is said to be connected or coupled to a second element, this encompasses cases where one or more intermediate element(s) may be employed to connect the two devices to each other. In contrast, when a first element is said to be directly connected or directly coupled to a second element, this encompasses cases where the two elements are connected together without any intervening element except any necessary electrical traces.

As described more fully below in accordance with a representative embodiment, a semiconductor structure comprises: a semiconductor substrate (alternatively referred to as "semiconductor die substrate") having a recess disposed beneath a semiconductor device; a thermally conductive core (alternatively referred to as "backside thermal core") disposed in the recess; and a package substrate comprising a heat sink. The heat sink is in thermal contact with the thermally conductive core.

In accordance with another representative embodiment, a semiconductor structure comprises: a first side and a second side; a recess in the semiconductor substrate; the recess being disposed beneath a semiconductor device. The semiconductor substrate has a first thickness between the semiconductor device and the recess that is less than a second thickness in all other locations between the first side and the second side. The semiconductor structure further comprises a thermally conductive core disposed in the recess. A thermal resistance between the first side and the second side in the other locations between the first side and the second side is substantially less than a thermal resistance through the first thickness and a lower side of the thermally conductive core.

FIG. 1 shows a cross-sectional view of a semiconductor structure 100 in accordance with a representative embodiment.

The semiconductor structure 100 comprises a semiconductor die substrate 101 disposed over a package substrate 102. The package substrate 102 comprises a heat sink illustratively comprising thermally conductive vias 103 disposed therein.

An active semiconductor region 104 is disposed over the semiconductor die substrate 101. A plurality of active semiconductor devices 105 are provided over the active semiconductor region 104, and illustratively comprise power transistors, such as may be contemplated for use in power amplifiers. In a representative embodiment, each of the active semiconductor devices 105 is connected to a respective pedestal 106.

A recess 107 is provided in the semiconductor die substrate 101 in a region beneath the active semiconductor devices 105. A backside ground plane 108 is disposed along inner walls of the recess 107, and a thermal backside core 109 is disposed in the recess 107.

A layer of die attach material 110 is provided between the semiconductor die substrate 101 and the package substrate 102, adhering a lower surface 111 of the semiconductor die substrate 101 to an upper surface 112 of the package substrate 102. For reasons described more fully below, the die attach material 110 may be provided over a first sidewall 113 (alternatively referred to as "inner surface") and a second sidewall 114 (alternatively referred to as "inner surface") of the recess 107.

The semiconductor structure 100 also comprises a wirebond 115 which is electrically connected to a wirebond pad 116 that is electrically connected to the active semiconductor region 104, and thus to the active semiconductor devices 105. Notably, the wirebond pad 116 is not necessarily connected directly to the active semiconductor region 104. Rather, the wirebond pad 116 may be connected to the active semiconductor region 104 and active semiconductor devices 105 through intervening electrical components, or circuits, or both. By way of example, electrical components, or circuits comprising capacitors, or inductors or resistors, or combinations thereof to form a circuit may be electrically connected between the wirebond pad 116 and the active semiconductor region 104. In a representative embodiment, the wirebond 115 provides one of an electrical signal or electrical power to the active semiconductor devices 105, with another wirebond (not shown) providing the other of the electrical signal or electrical power to the active semiconductor devices 105.

The semiconductor structure 100 also comprises a via 117 that electrically connects the backside ground plane 108 to the pedestals 106 by way of a conductive layer 118 therebetween. As can be appreciated, the via 117 provides the connection to ground for the active semiconductor devices 105.

The semiconductor die substrate 101 is generally electrically insulating. In accordance with representative embodiments, the semiconductor die substrate 101 comprises semiconductor materials used for the active semiconductor devices 105. These semiconductor materials include binary semiconductor materials including Group III-V semiconductor materials (e.g., GaAs, InP, AlAs, GaN, AlN, InN) and Group IV-VI semiconductor materials, ternary semiconductor materials, silicon (Si), silicon-germanium (SiGe), and alloys of some of these semiconductor materials.

The active semiconductor region 104 is illustratively an epitaxial layer comprising material(s) selected for the particular active semiconductor devices 105 implemented in the semiconductor structure 100 according to various representative embodiments. As will be appreciated by one of ordinary skill in the art, the active semiconductor devices 105 are disposed over or in the active semiconductor region 104.

Illustratively, the power transistors and power amplifiers comprising the active semiconductor devices 105 are contemplated for use in radio frequency (RF), microwave and millimeter wave applications. In accordance with certain representative embodiments, the active semiconductor devices 105 of the semiconductor die substrate 101 are heterojunction bipolar transistors (HBTs). Alternatively, the active devices may be pseudomorphic high electron mobility transistors (pHEMTs), HEMTs, metal-semiconductor field effect transistors (MESFETs), or other junction gate field effect transistors (JFETs) known to those of ordinary skill in the art. Still alternatively, the semiconductor material may comprise silicon and the active device may comprise a metal oxide semiconductor (MOS) device such as a MOS field effect transistor (MOSFET) or complementary MOS (CMOS) device. Essentially, and as will become clearer as the present description continues, the present teachings are contemplated for use when it is beneficial to remove heat generated by the active semiconductor devices 105 with improved efficiency compared to known semiconductor structures. As such, and more generally, the present teachings are applicable more broadly to a variety of electronic and optoelectronic applications.

The package substrate 102 is illustratively a multilayer substrate comprising a plurality of individual layers (not shown). As noted above, the package substrate 102 comprises thermally conductive vias 103, which form a heat sink for dissipating heat generated by the active semiconductor devices 105. As described more fully below, the thermally conductive vias 103 and the thermal backside core 109 form a comparatively improved thermal path for dissipating heat (represented in FIG. 1 with "squiggly" arrows) generated by the active semiconductor devices 105.

In accordance with a representative embodiment, thermally conductive vias 103 each comprise a material selected to provide suitable thermal conductivity, while also providing electrical conductivity to effect the connection from the backside ground plane 108 to electrical ground. In a representative embodiment, the material may be a thermal electrical conductor such as gold (Au), or copper (Cu), or silver (Ag), or aluminum (Al), or Tungsten (W) or alloys thereof. It is emphasized that this is merely illustrative and other materials may be used for the thermally conductive vias 103. To this end, the thermally conductive vias 103 may comprise virtually any metal. Moreover, in certain representative embodiments, more than one material may be used for the thermally conductive vias 103. For example, the outer portion of the thermally conductive vias 103 may comprise one material (e.g., copper) that is "filled" with another material (e.g., Al) such as a damascene via structure (not shown). Finally, the number of thermally conductive vias 103 depicted is merely illustrative, and more or fewer thermally conductive vias are contemplated. For example, a single thermally conductive via (e.g., a thermal "plug;" not shown) having a width substantially the same as the width ($w_1$) of the three thermally conductive vias 103 depicted in FIG. 1 is contemplated.

Notably, and although not depicted in the various Figs., the package substrate 102 illustratively comprises electrical circuits (not shown) at multiple depths (e.g., in multiple layers) in the package substrate 102. These electrical circuits may be selectively electrically connected through inter-level connections to provide electrical power, electrical signals, and ground between passive components and active components (e.g., active semiconductor devices 105) disposed over the package substrate 102.

The package substrate 102 comprises a dielectric material or a ceramic material. In some embodiments that comprise multiple layers, the constituent layers are generally made of the same material. Illustrative materials include, but are not limited to, a composite epoxy material comprising lateral fibers, prepreg, teflon, aluminum oxide, ceramic or glass materials. Depending on the application, a wide range of ceramic materials are also contemplated. Some examples include aluminum nitride, aluminum silicate, barium neodymium titanate, barium strontium titanate (BST), barium tantalate, barium titanate (BT), beryllia, boron nitride, calcium titanate, calcium magnesium titanate (CMT), magnesium aluminum silicate, lead zinc niobate (PZN), lithium niobate (LN), magnesium silicate, magnesium titanate, niobium oxide, porcelain, quartz, sapphire, strontium titanate, silica, tantalum oxide, and zirconium oxide.

Certain aspects of the package substrate 102 or components thereof may be found in commonly owned U.S. Patent Application Publication 20120049345 to Railkar, et al. and entitled "Substrate Vias for Heat Removal from Semiconductor Die;" and U.S. patent application Ser. No. 14/608,809 to Nathan Perkins, and entitled "Apparatus and Semiconductor Structure including a Multilayer Package Substrate." The entire disclosures of U.S. Patent Application Publication 20120049345 and U.S. patent application Ser. No. 14/608, 809 are specifically incorporated herein by reference in their entirety.

The recess 107 has a depth (in the z-direction according to the depicted coordinate system) that is selected to minimize a thickness $t_2$ of portion 119 of the semiconductor die substrate 101 in the region beneath the active semiconductor devices 105 and above the thermal backside core 109. Notably, and as described more fully below, the material used for the semiconductor die substrate 101 has a comparatively large thermal resistivity. As such, its is beneficial to reduce the thickness of the portion of semiconductor die substrate 101 in the thermal path for dissipating heat (represented in FIG. 1 with "squiggly" arrows) generated by the active semiconductor devices 105; this is done by minimizing the thickness $t_2$ of portion 119 of the semiconductor die substrate 101 in the region beneath the active semiconductor devices 105.

The recess 107 is provided in the semiconductor die substrate 101 using a known etching method. Illustratively, the via 117 is also provided during the process sequence as the recess 107.

In accordance with a representative embodiment, the recess 107 and the via 117 are formed using a known dry etching technique, such as a plasma etching method, suitable for etching the particular material used for the semiconductor die substrate 101.

Alternatively, a known wet-etching technique could be used to form the recess 107 and via 117 in the semiconductor die substrate 101. Notably, the aspect ratio of the recess 107 does not have to be comparatively high; illustratively less than 1. As such, the formation of recess 107 is relatively forgiving in terms of manufacturing tolerances, allowing for less sophisticated methods of manufacture to be employed. However, if desired, known methods to effect a comparatively high aspect ratio recess are contemplated by the present teachings.

In accordance with a representative embodiment, the recess 107 has a width ($w_2$ in the x-direction according to the depicted coordinate system) is typically in the range of approximately 100 μm to approximately 300 μm, but may be as great as approximately 1000 μm and a depth ($d_1$ in the y-direction according to the depicted coordinate system) of approximately 30% to approximately 90% of the thickness of semiconductor die substrate 101. By way of example, in a representative embodiment, the semiconductor die substrate 101 illustratively has a thickness of approximately 200 μm, so the recess 107 in this example would have a depth $d_1$ of approximate 60 μm to approximately 180 μm. Moreover, the thickness $t_2$ of portion 119 of the semiconductor die substrate 101 in the region between the recess 107 and an upper surface 120 has a thickness of approximately 70% to approximately 10% of the thickness of the semiconductor die substrate 101. Continuing with the example that the semiconductor die substrate 101 has a thickness of 200 μm, the thickness $t_2$ of portion 119 is approximately 140 μm to approximately 20 μm. Typically, the thickness $t_2$ of portion 119 (in the y direction according to the coordinate system of FIG. 1) is approximately 30 μm to approximately 100 μm. It is noted that the comparative width ($w_2$) and depth ($d_1$) of the recess 107, and thus the thickness $t_2$ of portion 119 of the semiconductor die substrate 101, are small compared to the overall dimensions of the semiconductor die substrate 101. Accordingly, while the comparatively small magnitude of the thickness $t_2$ of portion 119 of the electrically insulating semiconductor die substrate 101 in the thermal path for dissipating heat (represented in FIG. 1 with "squiggly" arrows) generated by the active semiconductor devices 105 is beneficial in improving the efficient removal of heat, it does not compromise the mechanical rigidity and strength of the semiconductor die substrate 101 or the semiconductor structure 100.

After the recess 107 and the via 117 are etched, the backside ground plane 108 is formed over their interior surfaces and over the lower surface 111 of the semiconductor die substrate 101. In a representative embodiment, the backside ground plane 108 comprises a suitable electrically conductive layer, such as a metal or metal alloy, and is deposited using a known method, such as a known sputtering method followed by a known plating method. In a representative embodiment, the backside ground plane is sputter deposited over the interior surfaces of the recess 107 to a comparatively thin thickness (e.g., on the order of $10^{-1}$ μm), followed by plating to a comparatively thin thickness (e.g., on the order of 10 μm).

After formation of the backside ground plane 108, the thermal backside core 109 is formed using a known plating technique such as described in commonly owned U.S. Patent Application Publications: 20120025370 and 20130134560 to Wholey, et al.; and 20120025269 to Parkhurst, et al. The disclosures of U.S. Patent Application Publications 20120025370, 20130134560, and 20120025269 are specifically incorporated by reference herein in their entirety. As described more fully below, the thermal backside core 109 has a thickness ($t_1$ in the y-direction in the coordinate system of FIG. 1) that is substantially the same as the depth ($d_1$) of the recess 107. In this way, the thermal backside core 109 is substantially flush with the lower surface of the backside ground plane 108 disposed over the lower surface 111 of the semiconductor die substrate 101.

Notably, in a representative embodiment, the backside ground plane 108 serves as a seed layer for the formation of the thermal backside core 109. In such an embodiment, the thermal backside core 109 would be made of the same material as the backside ground plane 108. Furthermore, providing the backside ground plane 108 on the inner surfaces of the recess 107 provides a diffusion barrier to prevent intermixing of the materials of the thermal backside core 109 and the semiconductor die substrate 101, and the active semiconductor region 104. Generally, the backside ground plane 108 comprises an electrically conductive material suitable to provide a desired function (e.g., seed layer, or diffusion barrier, or both), as well as to provide an electrical path to ground. Illustratively, the backside ground plane comprises and electrical conductor such as gold (Au), or copper (Cu), or silver (Ag), or aluminum (Al), or Tungsten (W) or alloys thereof.

The thermal backside core 109 generally comprises a material comprising a comparatively large thermal conductivity/comparatively small thermal resistivity. In a representative embodiment, the material used for the thermal backside core 109 may be a thermal electrical conductor such as gold (Au), or copper (Cu), or silver (Ag), or aluminum (Al), or Tungsten (W) or alloys thereof. It is emphasized that this is merely illustrative and other materials may be used for the thermal backside core 109. Moreover, in certain representative embodiments, more than one material may be used for the thermal backside core 109. For example, the outer portion of the thermal backside core 109 may comprise one material (e.g., copper) that is "filled" with another material (e.g., Al) such as a damascene via structure (not shown).

After the thermal backside core 109 is formed, the semiconductor die substrate 101 is bonded to the package substrate 102 with the thermal backside core 109 being aligned with the thermally conductive vias 103. The die attach material 110 is useful in bonding a metal or alloy layer to another layer, or a metal layer to a dielectric layer, or both. Illustratively, the die attach material 110 may be an electrically and thermally conductive material.

The thermal backside core 109 has a thickness (in the z-direction according to the coordinate system of FIG. 1) selected to substantially fill the recess. In some representative embodiments, the thermal backside core 109 is substantially flush with the lower surface of the backside ground plane 108 disposed over the lower surface 111 of the semiconductor die substrate 101. In other representative embodiments, the thermal backside core 109 has a thickness (in the z-direction according to the coordinate system of FIG. 1) that is slightly greater than the depth of the recess 107, and thus the thermal backside core 109 extends slightly beyond the opening of the recess 107 and is not flush with the lower surface of the backside ground plane 108 disposed over the lower surface 111 of the semiconductor die substrate 101. As described more fully below, by making the lower surface of the thermal backside core 109 substantially flush with the lower surface of the backside ground plane 108 disposed over the lower surface 111, or by making the thermal backside core 109 extend slightly beyond the opening of the recess 107, the thickness of die attach material 110 disposed between the thermal backside core 109 and the thermally conductive vias 103 can be minimized This is beneficial in many instances where the die attach material 110 has a comparatively high thermal resistivity, as discussed below.

Finally, as depicted in FIG. 1, the thermal backside core 109 is illustratively slightly less wide (in the x-direction according to the coordinate system of FIG. 1) than the width ($w_2$) of the recess 107. Die attach material 110 can then be provided between the sides of the thermal backside core 109 and the first and second sidewalls 113, 114 of the recess 107. Providing the die attach material 110 between the sides of the thermal backside core 109 and the first and second sidewalls 113, 114 beneficially reduces stress on the semiconductor structure 100 that can be caused by differences in the coefficients of thermal expansion of the various materials in the region of the thermal backside core 109 within the recess 107. Moreover, providing this slight gap between the sides of the thermal backside core 109 and the first and second sidewalls 113, 114 relaxes, to some extent, manufacturing tolerances of the semiconductor structure 100. Illustratively, depending on the plating method used to form the thermal backside core 109, the gap between the between the sides of the thermal backside core 109 and the first and second sidewalls 113, 114 is approximately 5 μm to approximately 75 μm. It is noted, however, that providing the die attach material 110 between the sides of the thermal backside core 109 and the first and second sidewalls 113, 114 is not required, and as such, may be foregone.

Figure 2:
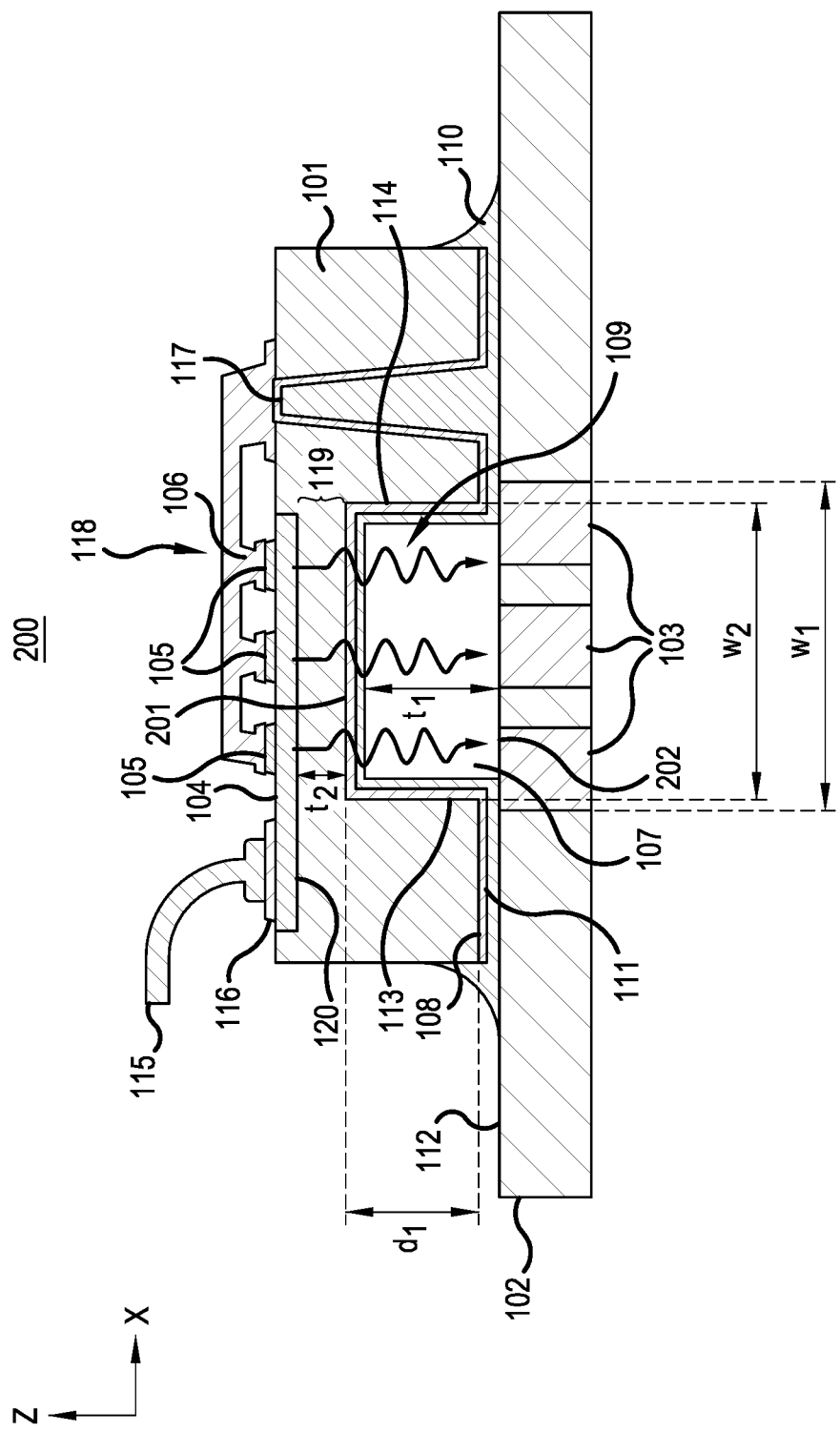
FIG. 2 shows a cross-sectional view of a portion of a semiconductor structure in accordance with a representative embodiment.

FIG. 2 shows a cross-sectional view of a semiconductor structure 200 in accordance with a representative embodiment. Many aspects and details of the semiconductor structure 200, which include illustrative materials, structures, methods of fabrication and dimensions, are substantively identical to those described above in connection with the description of semiconductor structure 100 presented above. Often, these common aspects and details, are not repeated in order to avoid obscuring the presently described representative embodiments.

The semiconductor structure 200 comprises semiconductor die substrate 101 disposed over package substrate 102. The package substrate 102 comprises a heat sink illustratively comprising thermally conductive vias 103 disposed therein.

Active semiconductor region 104 is disposed over the semiconductor die substrate 101. The plurality of active semiconductor devices 105 are provided over the active semiconductor region 104, and illustratively comprise power transistors, such as may be contemplated for use in power amplifiers. In a representative embodiment, each of the active semiconductor devices 105 is connected to respective pedestals 106.

Recess 107 is provided in the semiconductor die substrate 101 in the region beneath the active semiconductor devices 105. Backside ground plane 108 is disposed along inner walls of the recess 107, and the thermal backside core 109 is disposed in the recess 107.

The layer of die attach material 110 is provided between the semiconductor die substrate 101 and the package substrate 102, adhering the lower surface 111 of the semiconductor die substrate 101 to the upper surface 112 of the package substrate 102. For reasons described more fully below, the die attach material 110 is provided over the backside ground plane 108 that is disposed over an upper surface 201 of the recess 107. As described above, the die attach material 110 may also be provided over the first sidewall 113 and the second sidewall 114 of the recess 107.

The semiconductor structure 200 also comprises wirebond 115, which is electrically connected to wirebond pad 116 that is electrically connected to the active semiconductor region 104, and thus to the active semiconductor devices 105. In a representative embodiment, the wirebond 115 provides one of an electrical signal or electrical power to the active semiconductor devices 105, with another wirebond (not shown) providing the other of the electrical signal or electrical power to the active semiconductor devices 105.

The semiconductor structure 200 also comprises via 117 that electrically connects the backside ground plane 108 to the pedestals 106 by way of conductive layer 118 therebetween. As can be appreciated, the via 117 provides the connection to ground for the active semiconductor devices 105.

Semiconductor structure 200 differs from semiconductor structure 100 primarily in the process of fabrication, and certain aspects of the final product that result from this process. To this end, as described above, the thermal backside core 109 in the semiconductor structure 100 is formed in the recess 107, and the semiconductor die substrate 101 comprising the thermal backside core 109 provided in the recess 107 is then attached to the package substrate 102 while aligning the thermal backside core 109 with the thermally conductive vias 103, which form a heat sink. By contrast, in the semiconductor structure 200, the thermal backside core 109 is formed over the package substrate 102, and particularly over the thermally conductive vias 103 first. Once the thermal backside core 109 is formed over the package substrate 102, the semiconductor die substrate 101 is bonded to the package substrate 102 by aligning the recess 107 to receive the thermal backside core 109.

In the presently described representative embodiment, the thermal backside core 109 is formed over the package substrate 102 using a known method, such as electroplating. Like the backside ground plane 108, a seed layer (not shown) may be formed over the package substrate 102 to foster the plating of the thermal backside core 109 over the package substrate 102.

After fabrication of the thermal backside core 109, the semiconductor die substrate 101 is disposed over the package substrate 102, while aligning the recess 107 to receive the thermal backside core 109 therein. This alignment can be effected using a known method, such as by so-called pick-and-place technology, which is known to those of ordinary skill in the semiconductor arts.

The semiconductor die substrate 101 is bonded to the package substrate 102 using die attach material 110. In the depicted representative embodiment, the die attach material 110 is provided over backside ground plane 108 formed over first and second sidewalls 113, 114 and upper surface 201 of recess 107. This is merely illustrative, and the present teachings contemplate not providing the die attach material 110 over one or more of the first and second sidewalls 113, 114 and upper surface 201 of recess 107. Furthermore, and unlike semiconductor structure 100, because the thermal backside core 109 is formed over the package substrate 102 prior to bonding the package substrate 102 to the semiconductor die substrate 101, there is no die attach material 110 between a lower surface 202 of the thermal backside core 109 and the upper surface 112 of the package substrate 102. Beneficially, therefore, because the die attach material 110, which may have a comparatively high thermal resistivity, is foregone between a lower surface 202 of the thermal backside core 109 and the upper surface 112 of the package substrate 102, the thermal resistance in the thermal path for dissipating heat (represented in FIG. 2 with "squiggly" arrows) generated by the active semiconductor devices 105 to the thermally conductive vias 103, is lower compared to the same thermal path in the semiconductor structure 100.

Figure 3A:
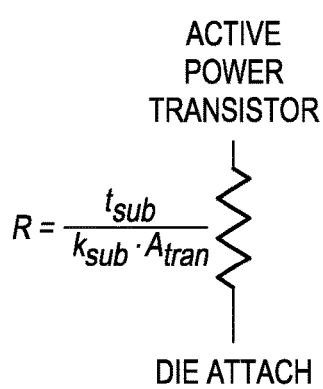
FIG. 3A depicts a simplified equivalent thermal resistance path of a known semiconductor structure.

FIG. 3A depicts a simplified equivalent thermal resistance path of a known semiconductor structure. Notably, the known semiconductor structure does not comprise a recess in a semiconductor die substrate, or a thermal backside core.

Figure 3B:
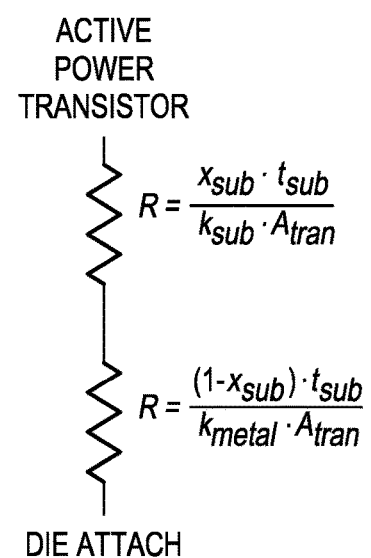
FIG. 3B depicts a simplified equivalent thermal resistance path of a semiconductor structure of a representative embodiment.

By contrast, FIG. 3B depicts a simplified equivalent thermal resistance path of a semiconductor structure of representative embodiments such as semiconductor structures 100, 200.

Notably, $t_{sub}$=the total thickness of the die substrate, comprising both the core and non-core portions; $k_{sub}$=the thermal conductivity of the non-core portion of the substrate; $A_{tran}$=the area of the active semiconductor devices (illustratively power transistors); $x_{sub}$=the fraction of the total substrate thickness in the core implementation that consists of non-metal; and $k_{metal}$=the thermal conductivity of the metal.

A review of these equivalent thermal resistance paths reveals a comparatively significant reduction in the thermal resistance provided by the semiconductor structures 100, 200, compared to the known semiconductor structure, the thermal resistance path of which is modeled in FIG. 3A. The clear differences can be more readily appreciated by comparing the thermal conductivities of various materials found in the thermal paths for dissipating heat generated by the active semiconductor devices 105 of the semiconductor structures 100, 200 versus the thermal path of the known semiconductor structure, which comprises only the semiconductor die substrate between the active semiconductor devices and the heat sink (e.g., thermally conductive vias 103 of the package substrate). Notably, Table 1 shows the thermal conductivities of illustrative materials:

TABLE 1

| Material | Thermal Conductivity (W/m-K) |
| --- | --- |
| Epoxy die attach | 5 |
| GaAs | 55 |
| Eutectic die attach | 58 |
| Au | 320 |
| Cu | 400 |

Consistent with the description of semiconductor structures 100, 200 above, it is useful to minimize the thickness $t_2$ of portion 119 of the semiconductor die substrate 101 in the region between the active semiconductor devices 105 and the thermal backside core. In the present illustration, the semiconductor die substrate is GaAs, which has a thermal conductivity that is approximately six (6) to nearly eight (8)

times less than that of gold or copper, respectively, that may be used for both the thermal backside core 109, but also the backside ground plane 108. By contrast, in the known semiconductor structure (not shown) that only has GaAs between the active semiconductor devices and the heat sink, the thermal resistance of the thermal path between the active semiconductor devices and the heat sink on the package substrate, as modeled in FIG. 3A is large compared to the thermal resistance of the thermal path between the active semiconductor devices 105 and the thermally conductive vias 103 of semiconductor structures 100, 200 as modeled in FIG. 3B. Finally, and as discussed more fully above, it is useful to minimize the thickness of the die attach material 110, or eliminate it completely from the thermal path between the active semiconductor devices 105 and the thermally conductive vias 103; for example, an epoxy die attach material or a eutectic die attach material used for die attach material 110 have comparatively poor thermal conductivities.

Figure 4:
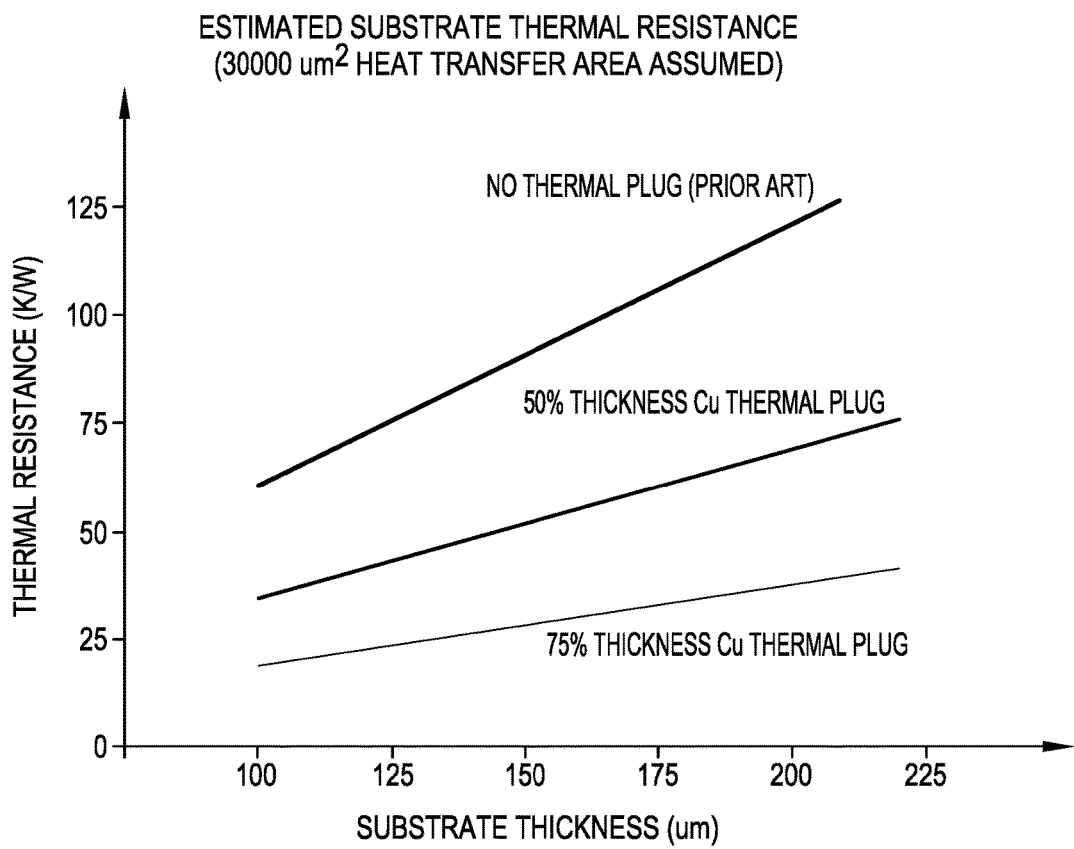
FIG. 4 is a graphical representation of thermal resistance versus substrate thickness of a known semiconductor structure and semiconductor structures of representative embodiments.

FIG. 4 is a graphical representation 400 of thermal resistance versus substrate thickness of a known semiconductor structure and semiconductor structures of representative embodiments. As noted, the heat transfer area, which is the area beneath the active semiconductor devices is approximately 3000 µm² for all data of graphical representation 400.

Curve 401 depicts the thermal resistance (K/W) versus semiconductor die substrate thickness for a known semiconductor structure. The known semiconductor structure has only a semiconductor die substrate material (e.g., GaAs) in the thermal path between the active semiconductor devices and the heat sink in the package substrate.

By comparison, curve 402 depicts the thermal resistance versus thickness of the semiconductor die substrate for a semiconductor substrate of a representative embodiment (e.g., semiconductor structures 100, 200 of representative embodiments described above). In the depicted embodiment, the thickness (z-direction in the coordinate systems of FIGS. 1 and 2) of the thermal backside core 109 is approximately 50% of the total thickness between the upper and lower surfaces 120, 111 of the semiconductor die substrate 101, whereas the remaining 50% of the thermal path is thickness $t_2$ of portion 119. As can be appreciated, the thermal resistance in the thermal path between the active semiconductor devices 105 and the thermally conductive vias 103 of semiconductor structures 100, 200 is significantly lower in curve 402 compared to curve 401.

Curve 402 depicts the thermal resistance versus thickness of the semiconductor die substrate for a semiconductor substrate of a representative embodiment (e.g., semiconductor structures 100, 200 of representative embodiments described above). In the depicted embodiment, the thickness (z-direction in the coordinate systems of FIGS. 1 and 2) of the thermal backside core 109 is approximately 75% of the total thickness between the upper and lower surfaces 120, 111 of the semiconductor die substrate 101, whereas the remaining 25% of the thermal path is thickness $t_2$ of portion 119. As can be appreciated, the thermal resistance in the thermal path between the active semiconductor devices 105 and the thermally conductive vias 103 of semiconductor structures 100, 200 is lower in curve 403 compared to curve 402, and significantly lower compared to curve 401. As such, reducing the thickness $t_2$ of portion 119 and increasing the thickness (z-direction in the coordinate systems of FIGS. 1 and 2) of the thermal backside core 109 to the extent practical is beneficial in improving the efficiency of heat dissipation (represented in FIGS. 1 and 2 with "squiggly" arrows) generated by the active semiconductor devices 105.

In view of this disclosure it is noted that the various semiconductor structures and apparatuses can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

What is claimed:

1. A semiconductor structure, comprising:
a semiconductor substrate having a recess disposed beneath a semiconductor device, wherein the recess does not extend through the semiconductor substrate;
a thermally conductive core disposed in the recess;
a package substrate comprising a heat sink, wherein the heat sink is in thermal contact with the thermally conductive core; and
a backside ground plane disposed over of the recess.

2. A semiconductor structure as claimed in claim 1, wherein the semiconductor substrate comprises a first side and a second side, the semiconductor substrate having a first thickness between the semiconductor device and the recess that is less than a second thickness in all other locations between the first side and the second side.

3. A semiconductor structure as claimed in claim 2, wherein the first thickness is substantially less than the second thickness.

4. A semiconductor structure as claimed in claim 1, wherein a first side of the thermally conductive core is attached to an upper wall of the recess, and a second side of the thermally conductive core is attached to an upper surface of the heat sink.

5. A semiconductor structure as claimed in claim 1, wherein the thermally conductive core is attached directly to the backside ground plane.

6. A semiconductor structure as claimed in claim 5, further comprising a die attach material disposed between a lower surface of the semiconductor substrate and an upper surface of the package substrate.

7. A semiconductor structure as claimed in claim 6, wherein the die attach material is disposed between a lower surface of the thermally conductive core and the heat sink.

8. A semiconductor structure as claimed in claim 5, further comprising a die attach material disposed on at least one inner wall of the recess.

9. A semiconductor structure as claimed in claim 1, wherein the thermally conductive core is attached directly to the heat sink.

10. A semiconductor structure as claimed in claim 9, further comprising a die attach material disposed between a lower surface of the semiconductor substrate and an upper surface of the package substrate.

11. A semiconductor structure as claimed in claim 9, further comprising a die attach material disposed on at least one side of the recess.

12. A semiconductor structure as claimed in claim 9, further comprising a die attach material disposed between an upper surface of the thermally conductive core and an upper surface of the recess.

13. A semiconductor structure as claimed in claim 1, wherein the semiconductor device comprises a power amplifier comprising the semiconductor substrate, the semiconductor substrate comprising one or more of gallium arsenide (GaAs), indium phosphide (InP), aluminum arsenide (AlAs), or alloys of GaAs, InP, AlAs.

14. A semiconductor structure as claimed in claim 13, wherein at least one of the semiconductor substrate comprises an active device.

15. A semiconductor structure as claimed in claim 14, wherein the active device comprises one or more of a metal-semiconductor field effect transistor (MESFET), a high electron mobility transistor (HEMT), a pseudomorphic HEMT, a junction field effect transistor (JFET), and a heterojunction bipolar transistor (HBT).

16. A semiconductor structure as claimed in claim 1, wherein the semiconductor substrate is electrically insulating.

17. A semiconductor structure as claimed in claim 1, wherein the semiconductor substrate comprises a material having a comparatively large thermal resistivity.

18. A semiconductor structure as claimed in claim 1, wherein the recess has a width in a range of approximately 100 µm to approximately 300 µm.

19. A semiconductor structure as claimed in claim 1, wherein the recess has a width in a range of approximately 100 µm to approximately 1000 µm.

20. A semiconductor structure as claimed in claim 1, wherein the recess has a width in a range of approximately 100 µm to approximately 300 µm.

21. A semiconductor structure as claimed in claim 1, wherein the semiconductor substrate has a thickness, and the recess has a depth of approximately 30% to approximately 90% of the thickness of semiconductor substrate.

22. A semiconductor structure as claimed in claim 1, wherein a portion of the semiconductor substrate in a region between the recess and an upper surface of the semiconductor substrate has a thickness of approximately 70% to approximately 10% of a thickness of the semiconductor substrate.

23. A semiconductor structure as claimed in claim 22, wherein the thickness of the portion is approximately 20 µm to approximately 20 µm.

24. A semiconductor structure as claimed in claim 22, wherein the thickness of the portion is approximately 30 µm to approximately 100 µm.

25. A semiconductor structure, comprising:
a semiconductor substrate having a recess disposed beneath a semiconductor device;
a thermally conductive core disposed in the recess;
a package substrate comprising a heat sink, wherein the heat sink is in thermal contact with the thermally conductive core;
a backside ground plane disposed over sidewalls and an upper wall of the recess, wherein sidewalls and an upper wall of the backside ground plane exist over respective sidewalls and an upper wall of the recess; and
die attach material disposed between the backside ground plane and the thermally conductive core on at least two sidewalls of the backside ground plane, but not between the upper wall of the backside ground plane and the thermally conductive core.

26. A semiconductor structure as claimed in claim 25, wherein a first side of the thermally conductive core is attached to an upper wall of the recess, and a second side of the thermally conductive core is attached to an upper surface of the heat sink.

27. A semiconductor structure as claimed in claim 26, wherein the die attach material is disposed between a lower surface of the thermally conductive core and the heat sink.

28. A semiconductor structure as claimed in claim 25, further comprising a die attach material disposed between a lower surface of the semiconductor substrate and an upper surface of the package substrate.

29. A semiconductor structure as claimed in claim 25, wherein the semiconductor device comprises a power amplifier comprising the semiconductor substrate, the semiconductor substrate comprising one or more of gallium arsenide (GaAs), indium phosphide (InP), aluminum arsenide (AlAs), or alloys of GaAs, InP, AlAs.

30. A semiconductor structure as claimed in claim 29, wherein at least one of the semiconductor substrate comprises an active device.

31. A semiconductor structure as claimed in claim 30, wherein the active device comprises one or more of a metal-semiconductor field effect transistor (MESFET), a high electron mobility transistor (HEMT), a pseudomorphic HEMT, a junction field effect transistor (JFET), and a heterojunction bipolar transistor (HBT).

32. A semiconductor structure as claimed in claim 25, wherein the semiconductor substrate is electrically insulating.

33. A semiconductor structure as claimed in claim 25, wherein the semiconductor substrate comprises a material having a comparatively large thermal resistivity.

34. A semiconductor structure as claimed in claim 25, wherein a recess has a width in a range of approximately 100 µm to approximately 300 µm.

35. A semiconductor structure as claimed in claim 25, wherein the recess has a width in a range of approximately 100 µm to approximately 1000 µm.

36. A semiconductor structure as claimed in claim 25, wherein the recess has a width in a range of approximately 100 µm to approximately 300 µm.

37. A semiconductor structure as claimed in claim 25, wherein the semiconductor substrate has a thickness, and the recess has a depth of approximately 30% to approximately 90% of the thickness of semiconductor substrate.

38. A semiconductor structure as claimed in claim 25, wherein a portion of the semiconductor substrate in a region between the recess and an upper surface of the semiconductor substrate has a thickness of approximately 70% to approximately 10% of a thickness of the semiconductor substrate.

39. A semiconductor structure as claimed in claim 38, wherein the thickness of the portion is approximately 20 µm to approximately 20 µm.

40. A semiconductor structure as claimed in claim 38, wherein the thickness of the portion is approximately 30 µm to approximately 100 µm.

41. A semiconductor structure as claimed in claim 1, wherein the recess comprises, first and second sidewalls on inner surfaces of the recess, and the backside ground plane is disposed over the first and second sidewalls.

42. A semiconductor structure as claimed in claim 1, wherein the recess comprises an upper inner surface, and the thermally conductive core is in direct contact with a portion of the backside ground plane disposed at the upper inner surface of the recess.

43. A semiconductor structure as claimed in claim 1, wherein the thermally conductive core is substantially flush with a lower surface of the backside ground plane.

44. A semiconductor structure as claimed in claim 1, wherein the thermally conductive core has a thickness that is greater than a depth of the recess.

45. A semiconductor structure as claimed in claim 1, wherein a gap exists between respective sides of the thermally conductive core, and the first and second sidewalls.

* * * * *